United States Patent [19]

Ito

[11] Patent Number: 4,780,847

[45] Date of Patent: Oct. 25, 1988

[54] SEMICONDUCTOR MEMORY

[75] Inventor: Akira Ito, Kunitachi, Japan

[73] Assignee: Hitachi, Ltd., Tokyo, Japan

[21] Appl. No.: 898,599

[22] Filed: Aug. 21, 1986

[30] Foreign Application Priority Data

Sep. 24, 1985 [JP] Japan .................. 60-208654

[51] Int. Cl.[4] .............................................. G11C 11/40
[52] U.S. Cl. .................... 365/154; 365/189; 365/182
[58] Field of Search ............... 365/154, 182, 189, 190, 365/230, 218, 222

[56] References Cited

U.S. PATENT DOCUMENTS 4,459,683  7/1984  Yalamanchili et al. ............. 365/154

Primary Examiner—Terrell W. Fears
Attorney, Agent, or Firm—Antonelli, Terry & Wands

[57] ABSTRACT

A static RAM in which the source of a MOSFET of a memory cell is connected to a signal line which supplies a high level or a low level depending upon a reset signal, the memory cell containing a pair of data-holding MOSFET's of which the gates and drains are cross-coupled.

30 Claims, 5 Drawing Sheets

SEMICONDUCTOR MEMORY

BACKGROUND OF THE INVENTION

The present invention relates to a semiconductor memory, and more specifically to an art that can be effectively adapted to, for example, CMOS (complementary MOS) static RAM (random access memory).

A semiconductor memory such as a static RAM effects the access with a relatively small number of bits such as one bit, four bits or eight bits, as a unit. Accompanying the progress in the semiconductor technology, furthermore, RAM's have been produced having very large memory capacities. Therefore, if the access is effected with a small number of bits, a tremendous number of memory cycles must be effected to set the initial condition or to write the data for clearing operation.

To set the initial condition of the RAM has been disclosed, for example, in Japanese Patent Laid-Open No. 124094/1984.

SUMMARY OF THE INVENTION

The object of the present invention is to provide a semiconductor memory which is capable of resetting the memory cells relying upon a simply constructed circuit structure.

The above and other objects as well as novel features of the present invention will become obvious from the description of the specification and the accompanying drawings.

A representative example of the invention disclosed in the specification will be described below briefly. Namely, the source of a MOSFET of a memory cell is connected to a signal line which assumes a high level or a low level depending upon a reset signal, the memory cell containing a pair of data-holding MOSFET's (metal oxide semiconductor field effect transistors) of which the gates and drains are cross-coupled.

DESCRIPTION OF THE PREFERRED EMBODIMENTS

Figure 1:
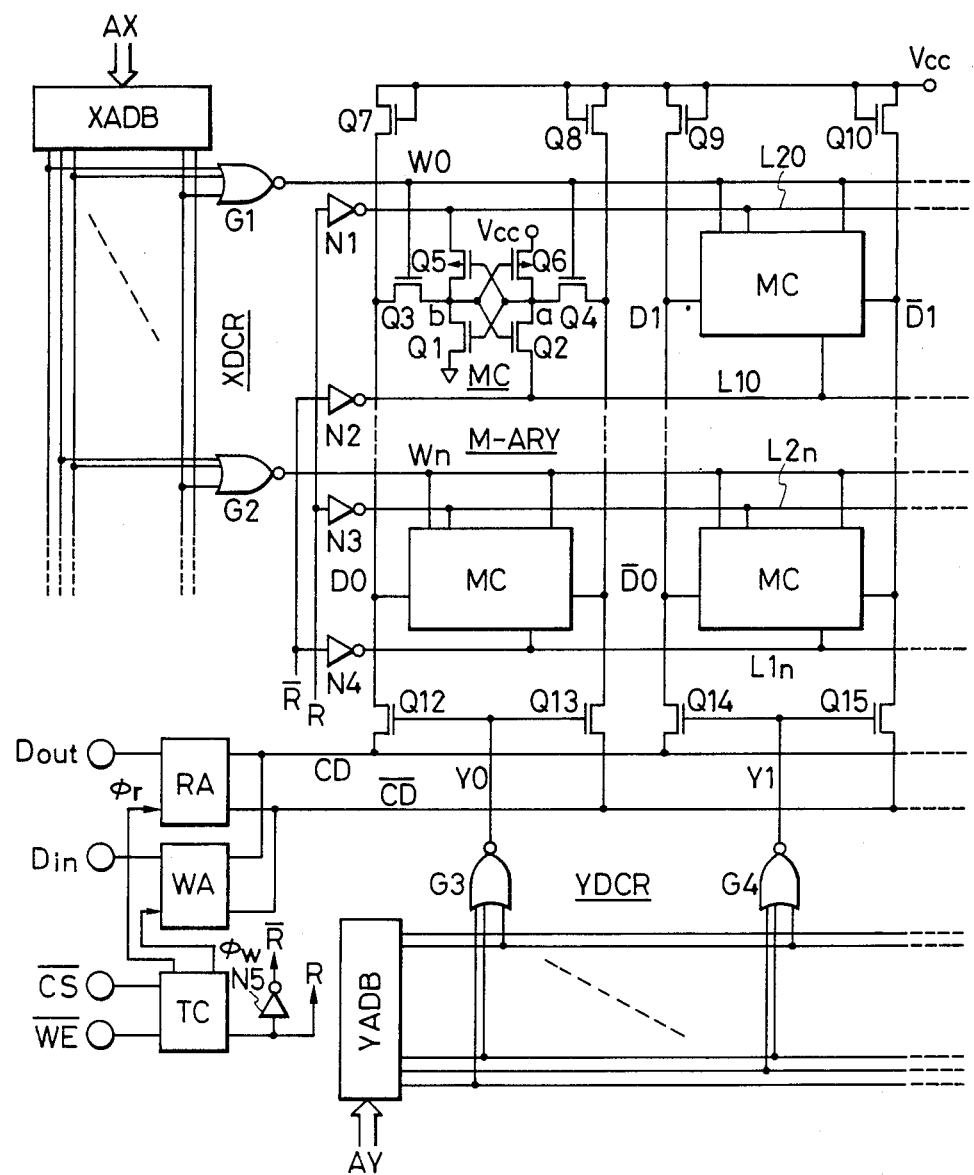
FIG. 1 is a circuit diagram showing a portion of a static RAM according to the present invention.

FIG. 1 is a circuit diagram of an embodiment of the present invention, wherein circuit elements are formed on a semiconductor substrate such as of a single crystalline silicon by the well-known technique for producing CMOS integrated circuits.

Though there is no particular limitation, the integrated circuit is formed on the semiconductor substrate composed of n-type single crystalline silicon. A p-channel MOSFET comprises a source region and a drain region formed in the semiconductor substrate, and a gate electrode composed of polycrystalline silicon formed, via a thin gate insulating film, on the surface of the semiconductor substrate between the source region and the drain region. An n-channel MOSFET is formed in a p-type well region that is formed on the surface of the semiconductor substrate. Thus, the semiconductor substrate constitutes a common body gate for a plurality of p-channel MOSFET's that are formed on the substrate. The p-type well region constitutes a body gate for the n-channel MOSFET that is formed therein. The structure in which the n-channel MOSFET that constitutes a memory cell is formed in the well region, is effective for preventing the stored data from being erroneously inverted by alpha particles.

A memory array M-ARY comprises a plurality of memory cells MC that are arranged in the form of a matrix as representatively shown in FIG. 1, word lines W0 to Wn, and complementary data lines D0 and $\overline{D0}$ to D1 and $\overline{D1}$.

The memory cells MC have the same structure. Namely, as represented by a specific circuit in FIG. 1, each memory cell MC includes a flip-flop circuit in which the inputs and outputs of a pair of CMOS inverter circuits are cross-coupled relative to each other, the pair of CMOS inverter circuits being composed of an n-channel MOSFET Q1 and a p-channel MOSFET Q5, and an n-channel MOSFET Q2 and a p-channel MOSFET Q6. N-channel transfer gate MOSFET's Q3 and Q4 are provided between a pair of input/output nodes b, a of the flip-flop circuit and the complementary data lines D0, $\overline{D0}$. Gates of transfer gate MOSFET's Q3, Q4 of the memory cells arranged along the same row are commonly connected to their corresponding word lines W0 to Wn as representatively shown. The input/output terminals of the memory cells arranged along the same column are connected to their corresponding pair of complementary data lines (bit lines or digit lines) D0 and $\overline{D0}$ or D1 and $\overline{D1}$ as representatively shown.

In FIG. 1, though there is no particular limitation among the complementary data lines D0, $\overline{D0}$, D1, $\overline{D1}$, and the power source voltage Vcc, there are provided n-channel load MOSFET's Q7 to Q10 that work as resistance elements when the power source voltage Vcc is steadily applied to the gates thereof.

In FIG. 1, the word line W0 is selected by an output signal produced by a NOR gate circuit G1 that is a unit circuit which constitutes an X-address decoder XDCR. This also holds true for other word lines Wn.

The X-address decoder XDCR is comprised of similar NOR gate circuits G1, G2, and the like. Internal complementary address signals are applied in predetermined combinations to the input terminals of the NOR gate circuits G1, G2. The internal complementary address signals are formed by an X-address buffer XADB that receives an external address signal AX (address signal produced by a suitable circuit that is not shown) which consists of a plurality of bits.

A pair of complementary data lines D0 and $\overline{D0}$ and another pair of complementary data lines D1 and $\overline{D1}$ in the above memory array, are connected to common complementary data lines CD, $\overline{CD}$ via column switching circuits which comprise n-channel transfer gate MOSFET's Q12, Q13, and Q14, Q15, that select the data lines. The input terminals of a reading circuit RA and the output terminals of a writing circuit WA are connected to the common complementary data lines CD, $\overline{CD}$. The reading circuit RA sends a read signal to a data output terminal Dout, and the writing circuit WA receives through its input terminal a write data signal that is supplied from a data input terminal Din.

The reading circuit RA includes a sense amplifier which performs the sensing operation maintaining a high sensitivity. The reading circuit RA is controlled for its operation by a control signal $\phi r$ that is supplied from a timing control circuit TC. When in operation, the reading circuit RA differentially amplifies the data signal supplied from the common complementary data lines CD and $\overline{CD}$, and sends the amplified data signal to the data output terminal Dout. When not in operation, the reading circuit RA assumes a high-impedance condition or a floating condition as viewed from the output terminal The writing circuit WA is controlled for its operation by a control signal $\phi$w. When in operation, the writing circuit WA sends complementary data signals to the common complementary data lines CD, $\overline{CD}$, the complementary data signals corresponding to the input data that is supplied from the data input terminal Din. When not in operation, the writing circuit WA assumes a high-impedance condition or a floating condition as viewed from the pair of output terminals.

Select signals Y0, Y1 formed by a Y-address decoder YDCR are supplied to the gates of MOSFET's Q12, Q13, Q14 and Q15 that constitute the column switching circuits. The Y-address decoder YDCR is constituted by similarly constructed NOR gate circuits G3, G4. Internal complementary address signals are applied in predetermined combinations to the NOR gate circuits G3, G4. The internal complementary address signals are formed by the Y-address buffer YADB that receives an external address signal AY (address signal produced by a suitable circuit that is not shown) which consists of a plurality of bits.

The external address signals AX and AY may be supplied to the address buffers XADB and YADB via external terminals, or may be supplied thereto via address buses from logic circuits such as microprocessors formed on the same semiconductor substrate as that of the static RAM.

Upon receipt of control signals from the external terminals $\overline{WE}$ and $\overline{CS}$, the timing control circuit TC produces the above-mentioned internal control timing signals $\phi$r, $\phi$w, as well as a reset signal R that will be described later.

According to this embodiment, the memory cells are constructed as described below so that they can be reset (cleared) at high speeds. The source of the n-channel MOSFET Q2 of one CMOS inverter circuit constituting the flip-flop circuit, is not connected to a ground potential point of the circuit that operates the inverter circuit, but is connected to a first signal line L10 to which is supplied an output signal of the CMOS inverter circuit N2 that receives an inverted reset signal $\overline{R}$. Sources of MOSFET's corresponding to MOSFET Q2 of other memory cells arranged along the same row, are commonly connected to the first signal line L10. The source of the p-channel MOSFET Q5 which constitutes another CMOS inverter circuit is not connected to the power source voltage Vcc that operates the inverter circuit, but is connected to a second signal line L20 to which is supplied the output signal of the CMOS inverter circuit N1 that receives the reset signal R. The sources of MOSFET's that correspond to the MOSFET Q5 of other memory cells are commonly connected to the second signal line L20.

Though there is no particular requirement, the signal lines L10 and L20 are extended in parallel with the word line W0, grounding line (not shown) for supplying ground potential of the circuit to the memory cells MC and a power source voltage line (not shown) that supplies the power source voltage Vcc to the memory cells MC. Preferably, these lines comprised of second aluminum wiring layers which are at the same level layer with these lines. The word line W0 is connected to the gate electrode which is made of a polycrystalline silicon film. Since the memory cell MC consumes a small amount of electric power, the signal lines L10 and L20, the grounding line and the power source voltage line need to be fine. Therefore, it is allowed to pass the wirings over the memory cells MC. The first aluminum wiring layer is used as the data lines D, $\overline{D}$, and is used to MOSFET's in the memory cell MC.

This also holds true for the memory cells of other rows and columns. In a memory cell of an n-th row, for example, the source of one n-channel MOSFET and the source of the other p-channel MOSFET are commonly connected to the first signal line L1n and the second signal line L2n, respectively, that are served with output signals of the CMOS inverter circuits N4 and N3.

The reset signal R formed by the timing control circuit TC is supplied to input terminals of the inverter circuits N1 and N3, and the reset signal $\overline{R}$ inverted by the CMOS inverter circuit N5 is supplied to input terminals of the inverter circuits N2 and N4. The inverter circuits N1 to N4 have the ability to drive the signal lines to which a plurality of memory cells are coupled.

Operation of the static RAM of FIG. 1 will now be described.

Under the chip select condition in which a chip select signal $\overline{CS}$ is at the low level, the timing control circuit TC discriminates the low level or the high level of a write enable signal $\overline{WE}$ to be the writing operation or the reading operation. In synchronism with the low level of the chip select signal $\overline{CS}$, the address buffers XADB and YADB receive external address signals AX and AY, generate complementary internal address signals and supply then to the decoders XDCR and YDCR. Therefore, a memory cell of one bit corresponding to one address is selected. Being suitably lagged behind the low level of the chip select signal $\overline{CS}$, a signal $\phi$w or $\phi$r is generated by the timing control circuit TC in response to the low level or high level of the write enable signal $\overline{WE}$. The signal $\phi$w makes the writing circuit WA operative. The writing circuit WA writes the signal supplied from the data input terminal Din onto the selected memory cell. When the signal $\phi$r is generated, the reading circuit RA is made operative. Therefore, the data stored in the selected memory cell is amplified by the reading circuit RA and is sent onto the data output terminal Dout. After the reading or writing operation has been finished, both the signals $\overline{CS}$ and $\overline{WE}$ raise to the high level.

When the data is to be input or output with a plurality of bits, such as four bits or eight bits, as a unit, there are provided a memory array M-ARY, circuits RA and WA, common complementary data lines CD, data input terminals Din and data output terminals Dout in a number of four or eight, respectively.

A reset mode is also prepared in addition to the ordinary reading and writing operation modes.

Figure 2:
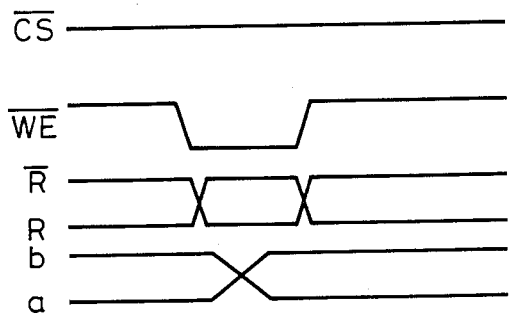
FIG. 2 is a diagram of timings for explaining the operation of the static RAM of FIG. 1.

Under the non-selected condition of chip (memory-holding condition) where the chip select signal $\overline{CS}$ is at the high level as shown in a timing diagram of FIG. 2, if the write enable signal $\overline{WE}$ falls to the low level which is a combination that will not take place in the ordinary operation mode, the timing control circuit TC discriminates it as a reset mode. When the reset mode is designated, the timing control circuit TC produces the reset signal R of the high level. In response thereto, the inverted reset signal $\overline{R}$ assumes the low level. The high level of the reset signal R is obtained as an output of the AND gate circuit which receives an inverted signal of the write enable signal $\overline{WE}$, and the chip select signal $\overline{CS}$.

Due to the high level of the reset signal R, the first signal lines L10 to L1n in each of the rows of the memory array M-ARY served with the output signals of the inverter circuits N2, N4, raise to a high level such as the power source voltage Vcc, and the second signal lines L20 to L2n served with the output signals of the inverter circuits N1, N3, fall to a low level such as the ground potential of the circuit.

Described below is the case where the low level is held at one input/output node a and the high level is held at the other input/output node b in the above-mentioned memory cell MC of which the circuit is concretely exemplified. The n-channel MOSFET Q2 and p-channel MOSFET Q5 are rendered conductive, and the n-channel MOSFET Q1 and p-channel MOSFET Q6 are rendered non-conductive. When the siqnal line L10 raise to the high level under this condition, the high level is transmitted to the node a via the n-channel MOSFET Q2 that is rendered conductive. When the signal ine L20 fall to the low level, the low level is transmitted to the node b via the p-channel MOSFET Q5 that is rendered conductive. As shown in FIG. 2, therefore, the node a is switched from the low level into the high level, and the node b is switched from the high level into the low level. Due to the high level of the node a, the n-channel MOSFET Q1 is switched from the non-conductive state into the conductive state, and the p-channel MOSFET Q5 is switched from the conductive state into the non-conductive state. Similarly, due to the low level of the node b, the p-channel MOSFET Q6 is switched from the non-conductive state into the conductive state, and the n-channel MOSFET Q2 is switched from the conductive state into the non-conductive state. Then, as the reset signal R falls to the low level (i.e., as the inverted reset signal $\overline{R}$ raises to the high level) due to the write enable signal $\overline{WE}$ of the high level, the low level such as ground potential of the circuit is supplied to the first signal line L10 and the high level such as power source voltage Vcc is supplied to the second signal line L20. That is, ground potential of the circuit is applied to the source of the n-channel MOSFET Q2, and power source voltage Vcc is applied to the source of the p-channel MOSFET Q5. Therefore, the memory cell MC maintains the reset condition, and operates as an ordinary flip-flop circuit.

If the node a assumes the high level and the node b assumes the low level prior to being reset, both the n-channel MOSFET Q2 and the p-channel MOSFET Q5 are under the non-conductive condition. Therefore, the data of reset condition is held irrespective of the levels of the signal lines L10 and L20

As the write enable signal $\overline{WE}$ raise to the high level again, the reset mode is discontinued, and the memory is placed under the non-selected condition. Thereafter, the memory is placed under the selected condition again by the chip select signal $\overline{CS}$ of the low level, whereby the above-mentioned reading operation or the writing operation is repeated, as required.

The reset mode is carried out when a program is to be started or finished, when the operation of the system is to be initiated, when the power source is connected, or when the data in the memory are to be invalidated.

The potential that is supplied to the source of the MOSFET Q2 during the reset mode should be a potential which is different from the potential for ( operating the inverter circuit (or the flip-flop circuit) or the potential supplied to the source of the MOSFET Q1. This maintains the memory cell placed under a predetermined condition. Similarly, the potential supplied to the source of the MOSFET Q5 during the reset mode should be a potential which is different from the potential for operating the inverter circuit or the potential supplied to the source of the MOSFET Q6.

According to the present invention, the following effects are obtained:

(1) The memory cell is reset when the high level is supplied at the time of reset operation, and holds the data when the low level is supplied during the ordinary operation to the source of a memory MOSFET in the memory cell that contains a pair of memory MOSFET's of which the gates and drains are cross-coupled. Therefore, a static RAM having a reset function and a data-holding function is realized by the addition of a simply constructed circuit without increasing the number of elements in the memory cells.

(2) Sources of the memory MOSFET's in the memory cells are commonly connected to a signal line that is constituted by the wiring of the same layer as the power source line or the grounding line of the circuit, and that extends in parallel with the word line, thereby to arrange the reset signal lines by utilizing space on the memory cells. This makes it possible to add the reset function without substantially sacrificing the degree of integration.

The foregoing specifically describes the invention accomplished by the inventors by way of an embodiment. It should, however, be noted that the present invention is in no way limited to the above-mentioned embodiment only, but can be modified in a variety of other ways without deparating from the spirit and scope of the invention.

Figure 3:
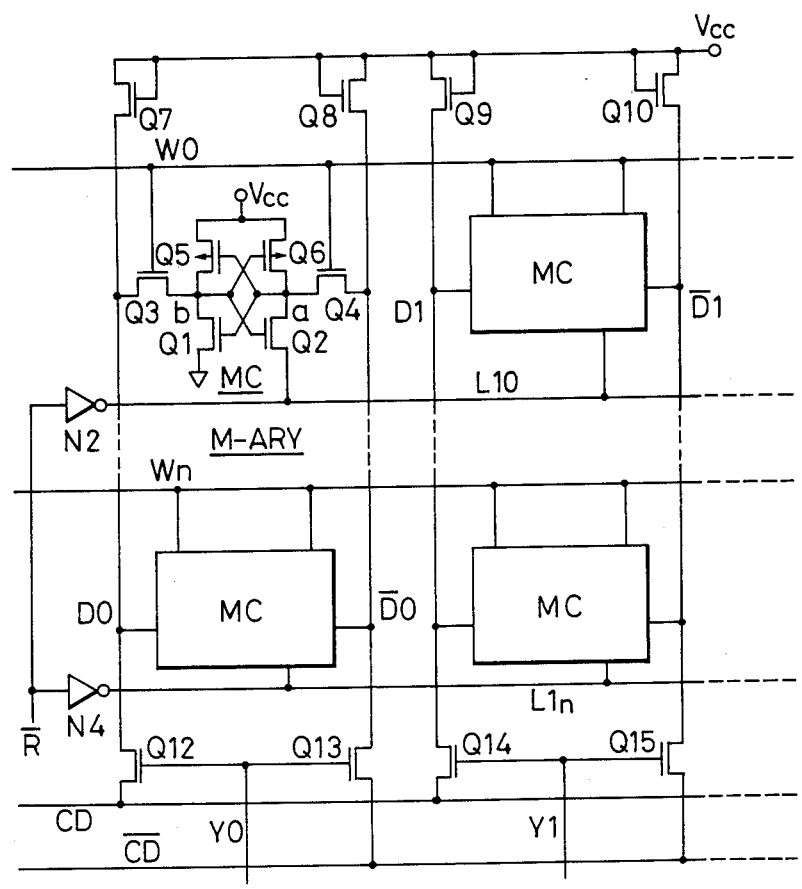
FIGS. 3 to 6 are circuit diagrams illustrating static RAM's according to other embodiments.
Figure 4:
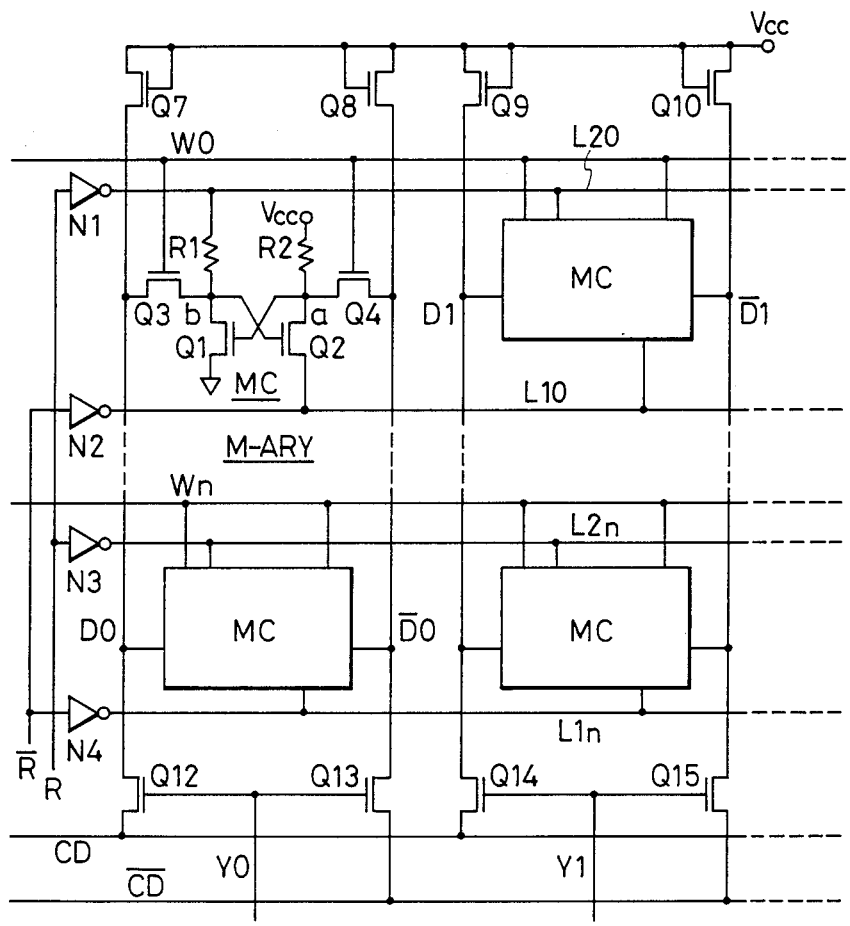

When the p-channel MOSFET's Q5 and Q6 in the flip-flop circuits of the memory cell have small conductances, the second signal lines L20 to L2n and the inverter circuits N1, N3 may be omitted as shown in FIG. 3. The source of MOSFET Q5 is connected to the power source voltage Vcc. In FIG. 3 (and in FIGS. 4 to 6), the decoders XDCR, YDCR are not shown, except the memory array M-ARY. In this case, if the node a is at the low level prior to the reset operation, the high level of the signal line L10 is transmitted to the node a via the MOSFET Q2 that is rendered conductive by the high level of the node b. The MOSFET Q1 is rendered conductive by the high level of the node a, whereby the node b fall to the low level to render the MOSFET Q2 non-conductive. Therefore, the reset signal of the high level is reliably transmitted to the node a, since there exists a delay time for discharging the node b to the low level by conductive state of the MOSFET Q1 after the node a has raised to the high level. Further, as the MOSFET Q1 is rendered conductive so that the node b falls to the low level, the p-channel MOSFET Q6 is rendered conductive and the node a maintains the high level. Thus, the memory cell can be reset first by the first signal line L1 alone. In the memory cell as shown in FIG. 4, resistors R1 and R2 may be employed in place of the p-channel MOSFET's Q5 and Q6, as load elements of the inverter circuits. The resistors R1 and R2 that work as load elements of the inverter circuits are composed of a polycrystalline silicon film formed on an intermediate insulating film on the MOSFET's Q1 and Q2, and have partly nondoped (intrinsic) areas to obtain high resistances. The MOSFET's Q1, Q2 and the resistors R1, R2 form a flip-flop circuit. Under the data-holding condition, however, the operating point is considerably different from that of the flip-flop circuit in an ordinary sense. To decrease the consumption of electric power in the above memory cell, the high-resistance polycrystalline silicon resistor R2 connected to the drain of the MOSFET Q2 has a very high resistance such that the gate voltage of the MOSFET Q2 is maintained slightly higher than the threshold voltage thereof when the MOSFET Q1 is rendered non-conductive. Similarly, the high-resistance polycrystalline silicon resistor R1 connected to the drain of the MOSFET Q1 also has a large resistance. In other words, the high-resistance polycrystalline silicon resistors R1, R2 have a resistance that is large enough to compensate for the drain leakage currents of the MOSFET's Q1, Q2. According to this structure, the memory cell is comprised of n-channel MOSFET's and polycrystalline silicon resistance elements R1, R2, despite the RAM being produced by the CMOS-IC technology. Such memory cells and memory array are compactly formed compared with the case of using p-channel MOSFET's. Namely, the polycrystalline silicon resistors R1, R2 can be formed over the MOSFET's Q1 and Q2.

Figure 5:
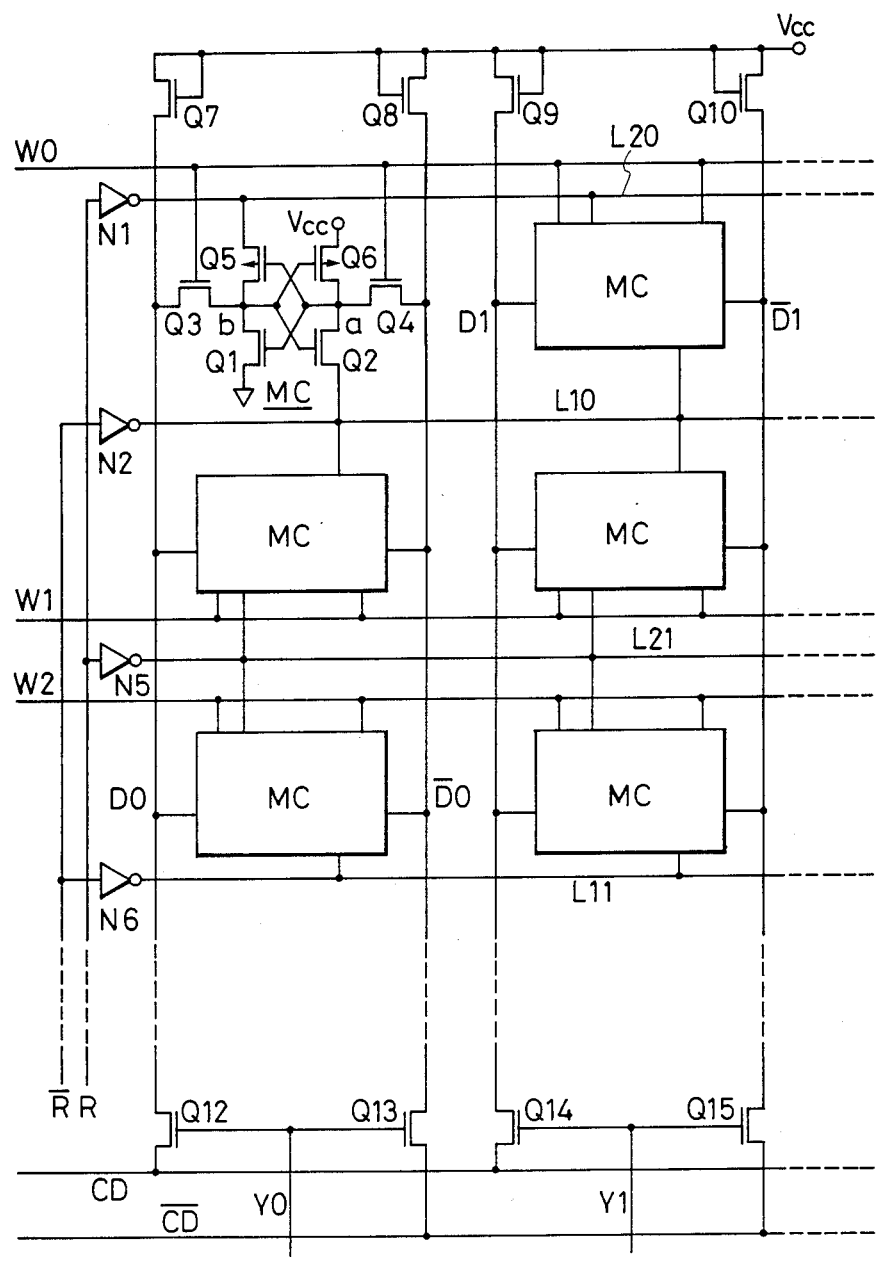

The first and second signal lines L1, L2 may be commonly provided for the row of a plurality of memory cells as shown in FIG. 5. The signal line L10 is a first signal line common for the memory cells that are connected to the word line W0 or W1. The signal line L21 is a second signal line common for the memory cells that are connected to the word line W1 or W2. Similarly, the first or second signal line is commonly possessed by the memory cells that are connected to the neighboring word lines. To realize this, the arrangement of the memory cells is changed. Namely, the memory cells connected to the word line W1 and the memory cells connected to the word line W0, are symmetrically arranged with respect to the signal line L10. Similarly, the memory cells that commonly share the signal line and that are connected to different word lines, are symmetrically arranged with respect to the signal line that is commonly shared. Symbols N5 and N6 denote CMOS inverter circuits that drive the signal lines L21 and L11.

Figure 6:
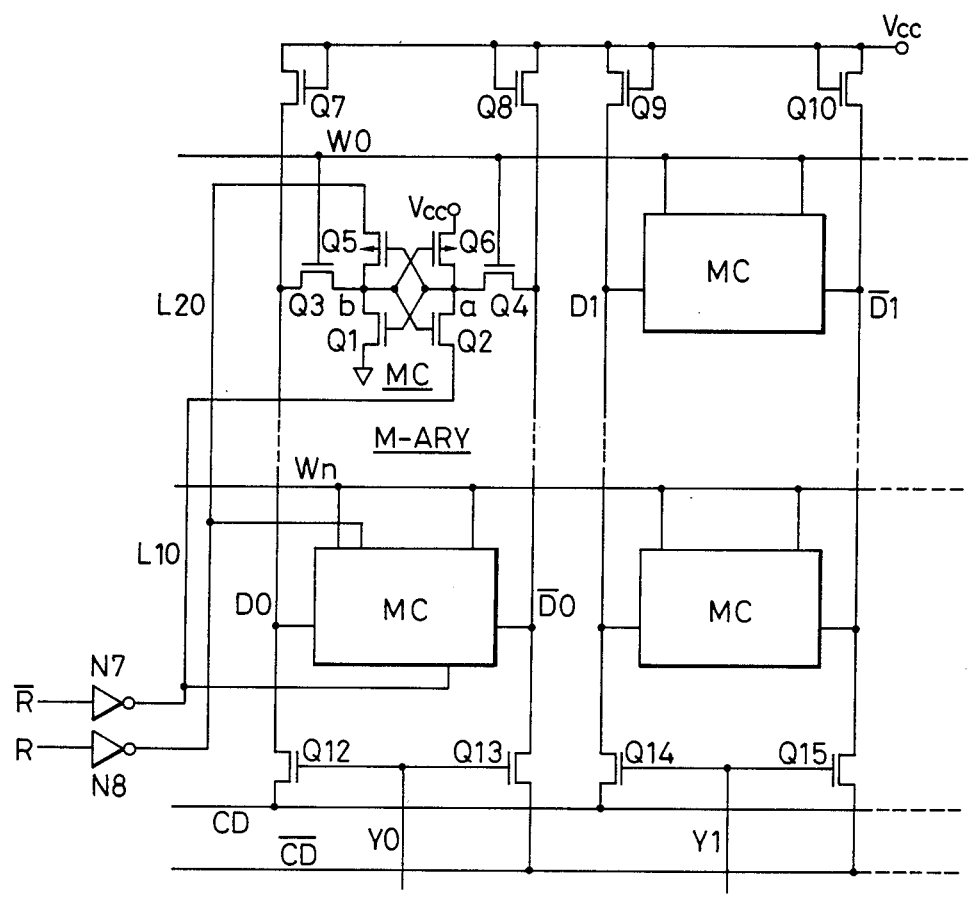

As shown in FIG. 6, the first and second signal lines may be extended in the same direction as the data lines D, and may be connected to the memory cells that are connected to the same data line. The first signal line L10 supplies the signal $\overline{R}$ inverted by the CMOS inverter circuit N7 to the sources of MOSFET's Q2 or to the sources of the corresponding MOSFET's of the memory cells that are connected to the data lines D0 and $\overline{D0}$. The second signal line L20 supplies the signal R inverted by the CMOS inverter circuit N8 to the source of the MOSFET Q5 or to the source of the corresponding MOSFET. The signal line L10 may be provided between the data lines $\overline{D0}$ and D1.

FIG. 6 illustrates an example in which the first and second signal lines L10 and L20 are connected to the memory cells of particular addresses only. That is, the first and second signal lines L1, L2 are provided for only those memory cells that correspond to the complementary data lines D0, $\overline{D0}$, but are not provided for the memory cells that correspond to other complementary data lines. In the memory cells to which the first and second signal lines are not connected, sources of the MOSFET's Q1 and Q2 are commonly connected to ground potential of the circuit, and sources of the MOSFET's Q5 and Q6 are commonly connected to the power source voltage Vcc. This structure is advantageous when the static RAM is to be used as a register. A plurality of memory cells coupled to a word line W form a register. When the memory array has n word lines and m data lines, it can be considered that there are n registers having m bits. There may exist an operation in which when a particular bit or a plurality of bits of the register are reset, the data of other bits are invalidated. In order to carry out such an operation, it is advantageous, as shown in FIG. 6, to provide first and second signal lines for the particular memory cells only and for the memory cells that are corresponded to the same data line. This operation occurs frequently when the static RAM is formed on a one-chip microcomputer, or on such a chip as a gate array (master slice-type) LSI or a logic LSI for a computer. In FIG. 6, the first and second signal lines may be provided each in a number of two or more, or may be so provided as to be connected to all of the memory cells.

It is permissible to suitably combine the embodiments shown in FIGS. 3 to 6.

When the static RAM is comprised of a semiconductor integrated circuit device, the reset signal R may be supplied from an independent external terminal. Further, the static RAM may be realized in a variety of forms by providing an additional circuit such as an equalizing MOSFET among the complementary data lines or for the common complementary data lines, or by providing precharging MOSFET's for the complementary data lines to constitute a static RAM of the synchronized type.

Moreover, as already mentioned, the static RAM may be the one that is incorporated in a custom integrated circuit (IC) such as a one-chip microcomputer or gate array, or that is incorporated in a variety of logic IC's for computers. That is, the static RAM referred to in this specification encompasses all of these embodiments. In this case, the reset signal R may be formed by the internal circuit.

The present invention can be adapted to a variety of types of static RAM's constituted by MOSFET's including MIS (metal insulator semiconductor) FET's that have a gate insulating film composed of a material other than the silicon oxide film. The present invention can further be adapted to a static RAM constituted by various transistors such as MES (metal semiconductor) FET's formed on a compound semiconductor substrate such as GaAs.

I claim:

1. A semiconductor memory comprising:
    a plurality of memory cells which store information therein, each of said plurality of memory cells including a pair of MISFETs having gates and drains thereof cross-coupled, wherein either one or the other of said pair of MISFETs is turned on in accordance with information to be stored in said memory cell;
    a supply line which is coupled to a source of one of said pair of MISFETs in each memory cell and to which a first reference potential is applied; and
    a first signal line which is coupled to a source of the other of said pair of MISFETs in each memory cell and to which either a second reference potential diffrent from said first reference potential or said first reference potential is supplied,
    wherein said second reference potential is supplied to said first signal line when the information stored in said plurality of memory cells is to be reset to predeteremined information.

2. A semiconductor memory comprising:
memory cells each including a flip-flop circuit for storing information having a pair of inverter circuits, said pair of inverter circuits having their inputs and outputs cross-coupled, each of said pair of inverter circuits further having first and second terminals to which predetermined potentials for operating are to be supplied;
a first supply line which is coupled to the first terminal of one of said pair of inverter circuits in each memory cell and to which a first potential is to be supplied;
means coupled to the second terminals of said pair of inverter circuits in each memory cell for supplying a second potential higher than the first potential thereto; and
a first signal line which is coupled to the first terminal of the other of said pair of inverter circuits in each memory cell and to which either a potential different from the first potential or the first potential is to be supplied, wherein the potential different from the first potential is supplied to said first signal line when the information stored in said plurality of memory cells is to be reset to predetermined information.

3. A semiconductor memory according to claim 2, wherein said inverter circuits comprise load elements coupled between the second terminal and the output terminal of the corresponding inverter circuit and n-channel MISFETs having the source-drain path coupled between the output terminal and the first terminal of the corresponding inverter circuit.

4. A semiconductor memory according to claim 3, wherein said load elements are p-chanel MISFETs having their gates coupled to gates of the corresponding n-channel MISFETs so that each of said inverter circuits includes a complementary MISFET inverter circuit.

5. A semiconductor memory accordiing to claim 3, wherein said load elements comprise resistor elements that are composed of a polycrystalline silicon film.

6. A semiconductor memory according to claim 3, wherein said second potential is supplied at all times to said load elements of said pair of inverter circuits.

7. A semiconductor memory according to claim 2, wherein said means includes a second signal line which is coupled to the second terminal of one of said pair of inverter circuits and to which either a potential different from said second potential or said second potential is to be supplied and wherein said potential different from said second potential is supplied to said second signal line when the information stored in said plurality of memory cells is to be reset to predetermined information.

8. A semiconductor memory according to claim 7, wherein the potential different from said first potential is said second potential, and the potential different from said second potential is said first potential.

9. A semiconductor memory according to claim 2, wherein the potential different from said first potential is said second potential.

10. A semiconductor memory comprising:
word lines that extend in a first direction;
data lines that extend in a second direction to intersect said word lines;
a memory cell array which includes a plurality of memory cells that are arranged at intersecting points of said word lines and said data lines and that are coupled to said word lines and said data lines so that a memory cell is coupled to a word line and at least one data line, said memory cells each including a flip-flop circuit that comprises a pair of inverter circuits having their input terminals and output terminals cross-coupled, each of said pair of inverter circuits further having first and second terminals to which predetermined potentials for operation are to be supplied, wherein the output terminals of said pair of inverter circuits have high and low levels, respectively, in response to the information stored in the corresponding memory cell;
a first supply line which is coupled to the first terminal of one of said pair of inverter circuits in each of the selected memory cells and to which a first potential is to be supplied;
means coupled to the second terminals of said pair of inverter circuits in each of said selected memory cells supplying a second potential higher than the first potential thereto; and
a first signel line which is coupled to the first terminal of the other of said pair of inverter circuits in each of said selected memory cells and to which either a potential differnt from the first potential or the first potential is to be supplied, wherein the potential different from the first potential is supplied to the first signal line when the information stored in the selected memory cells is to be reset to predetermined information.

11. A semiconductor memory according to claim 10, wherein said first signal line extends in said second direction.

12. A semiconductor memory according to claim 10, wherein said first signal line extends in said first direction.

13. A semiconductor memory according to claim 10, herein said selected memory cells are commonly connected to a predetermined data line.

14. A semiconductor memory according to claim 10, wherein said means includes a second signal line which is coupled to the second terminal of one of said pair of inverter circuits in each of said selected memory cells and to which either a potential different from said second potential or said second potential is to be supplied and wherein said potential different from said second potential is supplied to said second signal line when the information stored in said selected memory cells is to be reset to predetermined information.

15. A semiconductor memory according to claim 14, wherein said second signal line is provided in parallel with said first signal line.

16. A semiconductor memory according to claim 10, further comprising:
a terminal to which a control signal is to be applied; and
control means coupled to said first signal line and responsive to said control signal for generating a reset signal to said first signal line so that the potential different from said first reference potential is supplied to the first terminal of the other of said pair of inverter circuits.

17. A one-chip microcomputer including a semiconductor memory, said semiconductor memory comprising:

a plurality of memory cells which store information therein, each of said plurality of memory cells including a pair of MISFETs having gates and drains thereof cross-coupled, wherein either one or the other of said pair of MISFETs is turnd on in in accordance with information to be stored in said memory cell;

first means coupled to a source of one of said pair of MISFETs in each memory cell for supplying a first potential to the source thereof;

second means coupled to a source of the other of said pair of MISFETs in each memory cell for supplying either a second potential different from said first potential or said first potential to the source thereof; and control means coupled to said second means for controlling the supply of said second potential to the source of the other of said pair of MISFETs in each memory cell so that said second potential is applied to the source thereof when the information stored in said plurality of memory cells is to be reset to predetermined information.

18. A one-chip microcomputer according to claim 17, further comprising:

third means for supplying a third potential, wherein each of said plurality of memory cells further includes load elements coupled between said third means and the drains of said pair of MISFETs in each memory cell so that said third potential is supplied to said load elements.

19. A one-chip microcomputer according to claim 18, wherein said third means includes fourth means coupled to said load element which is coupled to the drain of one of said pair of MISFETs in each memory cell for supplying either a fourth potential different from said third potential or said third potential to said load element thereof, wherein said control means further includes fifth means coupled to said fourth means for controlling the supply of said fourth potential to said load element coupled to the drain of one of said pair of MISFETs in each memory cell so that said fourth potential is supplied to said load element thereof when the information stored in said plurality of memory cells is to be reset to the predetermined information.

20. A one-chip microcomputer according to claim 18, wherein said load elements includes resistor elements that are comprised of polycrystalliner silicon.

21. A one-chip microcomputer according to claim 18, wherein said pair of MISFETs includes n-channel MISFETs, and wherein said load elements include a pair of p-channel MISFETs each of which has a gate coupled to the gate of one of said n-channel MISFETs so that one of said n-channel MISFETs and one of said pair of p-channel MISFETs form a complementary MISFET inverter circuit.

22. A one-chip microcomputer according to claim 17, wherein said first potential is lower than said second potential.

23. A one-chip microcomputer according to claim 19, wherein said third potential is higher than said fourth potential.

24. A on-chip microcomuputer according to claim 19, wherein said third potential is said second potential, and wherein said fourth potential is said first potential.

25. A one-chip microcomputer according to claim 17, further comprising:

a plurality of word lines and a plurality of pairs of data lines coupled to said plurality of memory cells so that a memory cell is coupled to a word line and a pair of data lines.

26. A memory device comprising:

a plurality of memory cells which store information therein, each of said plurality of memory cells including a pair of MISFETs having gates and drains thereof cross-coupled, wherein either one or the other of said pair of MISFETs is turned on in accordance with information to be stored in said memory cell;

terminals to which control signals for controlling an operation of the memory device are to be applied;

discriminator means responsive to said control signals for discriminating whether or not control signals indicate a reset mode that the information stored in said plurality of memory cells is to be reset to predetermined information; and supply means coupled to sources of said pair of MISFETs including first means for supplying potentials to said sources that have substantially the same potential levels to each other and second means responsive to an output signal of said discriminator means for respectively supplying potentials to said sources that have different potential levels from each other.

27. A microcomputer formed in a semiconductor chip, said microcomputer comprising:

a plurality of memory means for storing information therein, each including a pair of MISFETs having gates and drains thereof cross-coupled, wherein either one or the other of said pair of MISFETs is turned on in accordance with information to be stored therein;

terminals to which control signals for controlling an operation of said plurality of memory means are to be applied;

discriminator means responsive to said control signals for discriminating whether or not control signals indicate a reset mode that the information stored in said plurality of memory means is to be reset to predetermined information; and supply means coupled to sources of said pair of MISFETs for respectively supplying a first potential to one of the sources and a second potential to the other of the sources, said supply means including first means for supplying the first and second potential with substantially the same potential levels to each other to the sources and second means responsive to an output of said discriminator means for supplying the first and second potential with different potential levels to each other to the sources.

28. A microcomputer according to claim 27, further comprising:

a plurality of word lines and a plurality of pairs of data lines coupled to said plurality of memory means so that a word line and a pair of data lines are coupled to one memory means.

29. A microcomputer according to claim 28, wherein the memory means coupled to said one word line in said plurality of word lines include a resistor.

30. A semiconductor memory according to claim 16, wherein said control signal includes a write enable signal, and said reset signal is generated in response to the generation of said write enable signal when said memory cell array is under the non-selected condition.

* * * * *